(12) United States Patent
Aikawa et al.

(10) Patent No.: US 7,222,144 B2
(45) Date of Patent: May 22, 2007

(54) WEIGHT MEASUREMENT APPARATUS, METHOD OF ELIMINATING NOISE AND METHOD OF DESIGNING DIGITAL FILTER

(75) Inventors: Naoyuki Aikawa, Shiga (JP); Tohru Morichi, Shiga (JP); Yukio Wakasa, Shiga (JP)

(73) Assignee: Ishida Co., Ltd., Kyoto (JP)

( * ) Notice: Subject to any disclaimer, the term of this patent is extended or adjusted under 35 U.S.C. 154(b) by 715 days.

(21) Appl. No.: 10/693,973

(22) Filed: Oct. 28, 2003

(65) Prior Publication Data
US 2004/0088342 A1    May 6, 2004

(30) Foreign Application Priority Data
Oct. 29, 2002    (JP)    ............ P2002-314515

(51) Int. Cl.
*G06F 17/10*    (2006.01)
(52) U.S. Cl. ............... 708/319; 708/323
(58) Field of Classification Search ......... 708/300, 708/319, 323
See application file for complete search history.

(56) References Cited

U.S. PATENT DOCUMENTS

| | | | |
|---|---|---|---|
| 4,489,391 A | * | 12/1984 | Morikawa .......... 708/320 |
| 5,737,254 A | * | 4/1998 | Lane et al. .......... 708/320 |
| 6,404,832 B2 | * | 6/2002 | Abe .......... 375/350 |

FOREIGN PATENT DOCUMENTS

JP    6-21814    12/1987

OTHER PUBLICATIONS

Naoyuki Aikawa, et al. "Design for FIR Transmitter and Receiver Filters for Data Communication System" in Transaction of IEICE, Mar. 1996, vol. J79-A, No. 3, pp. 608-615.

* cited by examiner

*Primary Examiner*—Chuong D. Ngo
(74) *Attorney, Agent, or Firm*—Staas & Halsey LLP

(57) ABSTRACT

A filtering technique which makes it possible to easily and appropriately eliminate a noise without increasing a scale of a circuit necessary for a filtering process even if a noise frequency is liable to be changed is provided. A filter coefficient calculator (6) of a weight measurement apparatus calculates filter coefficients using a predetermined arithmetic expression and outputs them to a signal processor (5). The signal processor (5) carries out a filtering process on a weighing signal (Ds) using the filter coefficients. The arithmetic expression includes a parameter specifying a band position of an attenuation band where attenuation must be locally enhanced. A user can input a value of the parameter via a data entry part (7). In this manner, the filter coefficients can be changed by using a parameter specifying the band position of the attenuation band which is physical and thus easy to grasp. Accordingly, it is possible to easily move the attenuation band, and thus noise can be eliminated easily and appropriately.

9 Claims, 9 Drawing Sheets

F I G. 4
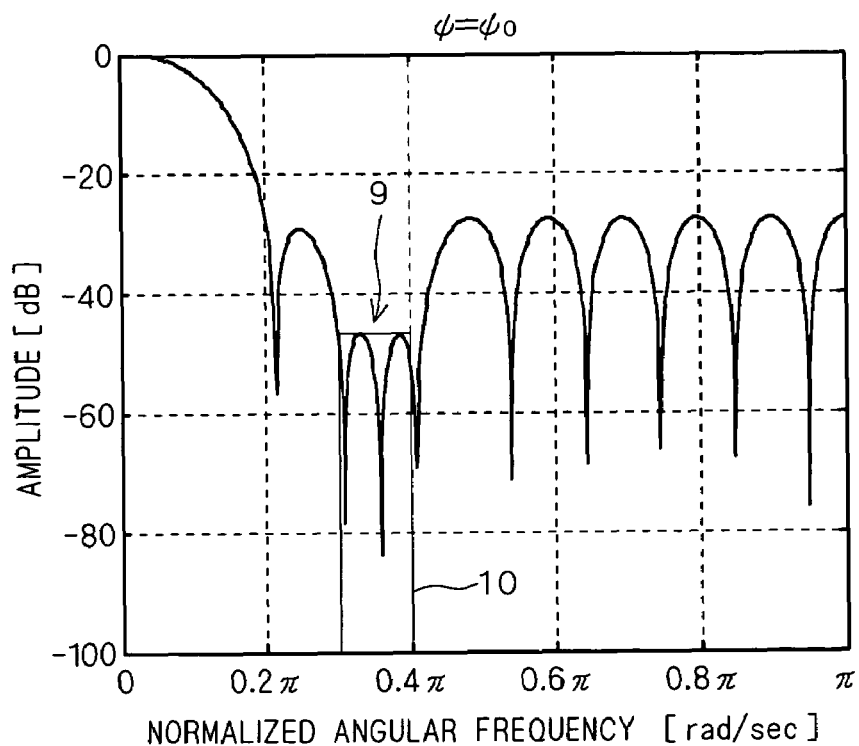
F I G. 5
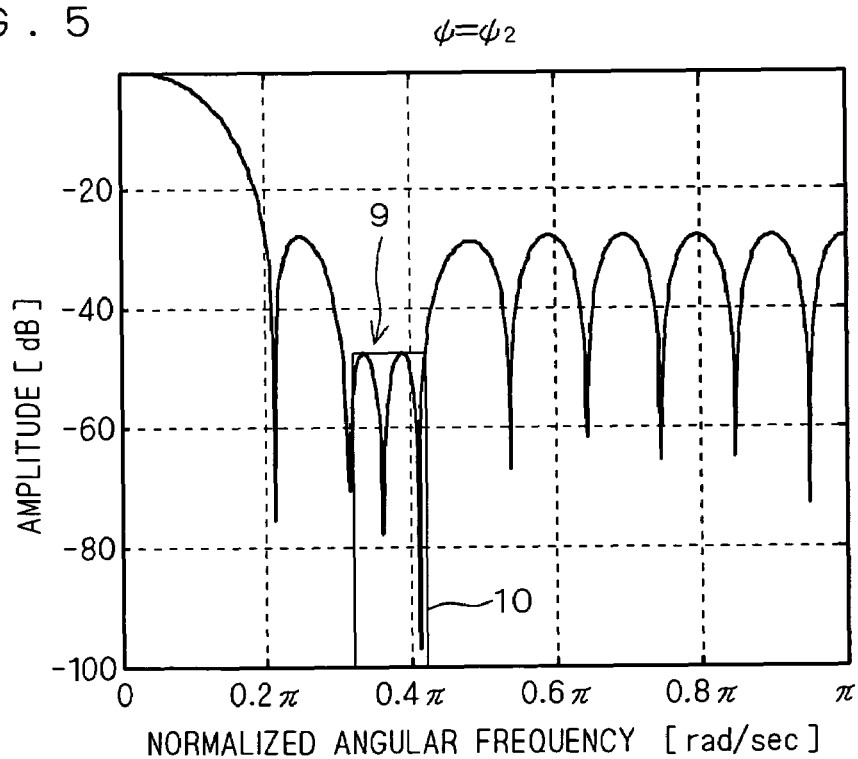

| | ORDER OF POLYNOMIAL | | | | | |
|---|---|---|---|---|---|---|
| | j = 0 | j = 1 | j = 2 | j = 3 | j = 4 | j = 5 |
| i=0 | 7.2E-07 | -2.4E-05 | 0.000295 | -0.001430 | 0.001546 | 0.126876 |
| i=1 | 3.6E-07 | -1.2E-05 | 0.000152 | -0.000800 | 0.001259 | 0.243199 |
| i=2 | -8.9E-07 | 2.77E-05 | -0.000320 | 0.001367 | -0.000370 | 0.216402 |
| i=3 | 7.8E-07 | -2.1E-05 | 0.000188 | -0.000790 | 0.001842 | 0.182503 |
| i=4 | 1.79E-06 | -5.6E-05 | 0.000624 | -0.002890 | 0.003532 | 0.144324 |
| i=5 | 1E-07 | -3.6E-06 | 5.47E-05 | -0.000310 | 0.000276 | 0.099327 |
| i=6 | -1.8E-06 | 5.55E-05 | -0.000620 | 0.002845 | -0.003440 | 0.050270 |
| i=7 | -5.8E-07 | 1.86E-05 | -0.000210 | 0.001067 | -0.001900 | 0.011368 |
| i=8 | 2.5E-07 | -1.4E-05 | 0.000215 | -0.001100 | 3.88E-05 | -0.002440 |
| i=9 | -1.1E-06 | 3.83E-05 | -0.000490 | 0.002576 | -0.004780 | 0.006051 |
| i=10 | -3.9E-07 | 1.64E-05 | -0.000240 | 0.001269 | -0.001310 | -0.035490 |

FIG. 14

| | MAXIMUM ERROR IN OPTIMUM FILTER | | | | MAXIMUM ERROR IN APPROXIMATION BY Mth ORDER POLYNOMIAL | | | |
|---|---|---|---|---|---|---|---|---|
| | FREQUENCY RANGE ① | FREQUENCY RANGE ② | FREQUENCY RANGE ③ | FREQUENCY RANGE ④ | FREQUENCY RANGE ① | FREQUENCY RANGE ② | FREQUENCY RANGE ③ | FREQUENCY RANGE ④ |
| $\phi_0$ | 0.0420 | 0.0420 | 0.0042 | 0.0420 | 0.0424 | 0.0383 | 0.0043 | 0.0425 |
| $\phi_1$ | 0.0420 | 0.0420 | 0.0042 | 0.0420 | 0.0406 | 0.0398 | 0.0043 | 0.0425 |
| $\phi_2$ | 0.0420 | 0.0420 | 0.0042 | 0.0420 | 0.0407 | 0.0413 | 0.0042 | 0.0408 |
| $\phi_3$ | 0.0420 | 0.0420 | 0.0042 | 0.0420 | 0.0415 | 0.0417 | 0.0042 | 0.0416 |
| $\phi_4$ | 0.0420 | 0.0420 | 0.0042 | 0.0420 | 0.0423 | 0.0420 | 0.0043 | 0.0423 |
| $\phi_5$ | 0.0420 | 0.0420 | 0.0042 | 0.0420 | 0.0427 | 0.0424 | 0.0044 | 0.0428 |
| $\phi_6$ | 0.0420 | 0.0420 | 0.0042 | 0.0420 | 0.0425 | 0.0425 | 0.0046 | 0.0428 |
| $\phi_7$ | 0.0420 | 0.0420 | 0.0042 | 0.0420 | 0.0418 | 0.0420 | 0.0047 | 0.0417 |
| $\phi_8$ | 0.0420 | 0.0420 | 0.0042 | 0.0420 | 0.0408 | 0.0408 | 0.0049 | 0.0407 |
| $\phi_9$ | 0.0420 | 0.0420 | 0.0042 | 0.0420 | 0.0393 | 0.0391 | 0.0048 | 0.0396 |
| $\phi_{10}$ | 0.0420 | 0.0420 | 0.0042 | 0.0420 | 0.0377 | 0.0377 | 0.0046 | 0.0377 |

WEIGHT MEASUREMENT APPARATUS, METHOD OF ELIMINATING NOISE AND METHOD OF DESIGNING DIGITAL FILTER

BACKGROUND OF THE INVENTION

1. Field of the Invention

The present invention relates to a filtering technique carried out by using a digital filter.

2. Description of the Background Art

A weight measurement apparatus for measuring a weight of an article typically employs a weight sensor such as a strain gauge load cell or a force balance. The weight sensor has a natural frequency which is subject to a total weight of a weight of an article and a tare thereof. When external vibration at frequencies in a band including the natural frequency acts upon a weight measurement system, external vibration at a frequency close to the natural frequency is amplified, to work as a vibration noise, which then emerges in a weighing signal output from the weight sensor. It is noted that such a vibration noise will be hereinafter referred to as a "natural frequency noise" throughout the present specification.

Also, in measuring a load of a transfer system, a noise caused due to vibration of a rotation system such as a motor for driving a conveyor belt or a transfer roller, or an electrical noise associated with a commercial power supply, works as a vibration noise which is superimposed on a weighing signal.

A weight measurement apparatus developed in recent days has employed a digital filter for eliminating such a vibration noise as described above which is contained in a weighing signal. A digital filter is relatively impervious to influence of aging or an environment, and filtering characteristics thereof can be relatively easily altered. Among various types of digital filters, a finite impulse response (FIR) filter has been preferably employed in view of its excellent stability.

As described above, a natural frequency of a weight sensor is subject to an article weight and a tare. Thus, if an article weight or a tare is changed, it results in change in a frequency of a natural frequency noise associated with the weight sensor. Formerly, change in frequency of a natural frequency noise caused due to change in article weight was negligible because a tare, e.g., a weight of a conveyor, was dominant. However, in recent days, there has been arisen a demand for accurate measurement of a weight of a light article, which involves reduction of a tare. For this reason, such change in frequency of a natural frequency noise caused due to change in article weight has become too significant to neglect. On the other hand, a frequency of a vibration noise associated with a motor or a transfer roller is changed in accordance with specifications of a transfer system such as a transfer speed, for example. Hence, it is desired to achieve a digital filter which is capable of surely eliminating a vibration noise in spite of change in frequency of the vibration noise which occurs due to change in type or size of an article under measurement, or change in specifications of a transfer system.

In accordance with the conventional practices, a digital filter formed of multistage moving average filters is employed in order to surely eliminate a vibration noise contained in a weighing signal, as taught in Japanese Patent No. 6-21814 (hereinafter referred to as "JP 6-21814").

More specifically, JP 6-21814 teaches a method in which respective moving average values of the multistage moving average filters are differentiated from one another to provide a plurality of notches in a frequency range within which a frequency of a vibration noise would be changed, thereby surely eliminating the vibration noise.

Additionally, an example of a method of designing an FIR filter is described in "Design of FIR Transmitter and Receiver Filters for Data Communication System" by Naoyuki Aikawa et al. in Transaction of IEICE, Vol. J79-A, No. 3, Mar. 1996, pages 608-615, which shows a technique using successive projections method.

According to the method shown in JP 6-21814, a frequency range within which a frequency of a vibration noise would be changed is presumed and the number of stages of the moving average filters is determined in accordance with the frequency range as presumed, in a step of designing a digital filter. As such, in a situation where the frequency of the vibration noise falls outside the presumed frequency range for some reason such as addition of a specification after designing the digital filter, it is required to design a digital filter all over again.

In this regard, to initially design a digital filter which allows for addition of a specification in a weight measurement apparatus requires preparing numerous multistage moving average filters, which results in increase of a circuit scale of the digital filter.

On the other hand, as an alternative to the method taught in JP 6-21814, there has been proposed a method in which a plurality of filter coefficients representing different attenuation characteristics are previously stored. According to this method, each time a frequency of a vibration noise is changed due to change in specifications or the like, one of the stored filter coefficients is retrieved in accordance with a new frequency of the vibration noise after the change, to be used. However, this alternative requires previously storing numerous filter coefficients in order to surely eliminate a vibration noise at a wide range of frequencies, which results in increase of a circuit scale of a memory for storing the filter coefficients.

SUMMARY OF THE INVENTION

It is an object of the present invention to provide a filtering technique which makes it possible to easily and appropriately eliminate a noise without increasing a scale of a circuit necessary for a filtering process even if a noise frequency is liable to be changed.

According to the present invention, a weight measurement apparatus includes a signal processor and a filter coefficient calculator. The signal processor carries out a filtering process on a weighing signal which is obtained by digitizing a signal resulted from detection of a weight of an object, by using variable filter coefficients. The filter coefficient calculator calculates the filter coefficients using a predetermined arithmetic expression and outputs the filter coefficients to the signal processor. The arithmetic expression includes a parameter specifying a band position of an attenuation band where attenuation is to be enhanced locally in a stopband of amplitude characteristics of the filtering process. The filter coefficient calculator substitutes an input value of the parameter into the arithmetic expression, to change the filter coefficients so that the attenuation band is movable to the band position specified by the parameter.

The present invention is also intended for a method of eliminating a noise employed in a weight measurement apparatus.

The filter coefficients can be changed by using the parameter specifying the band position of the attenuation band which is physical and thus easy to grasp. As such, even when a frequency which must be attenuated is changed, it is possible to easily move the attenuation band by referring to information about a new frequency which must be attenuated. Accordingly, a frequency of a noise included in a weighing signal, which is liable to be changed, can be filtered out easily and appropriately. Further, since the filter coefficients are obtained by the arithmetic expression, there is no need of preparing multistage filters or previously storing filter coefficients representing different characteristics. This makes it possible to reduce a scale of a circuit necessary for the filtering process and to thus provide a low cost weight measurement apparatus to users.

Preferably, the arithmetic expression is an approximate expression based on at least three sequences of reference filter coefficients, the at least three sequences of the reference filter coefficients correspond to reference amplitude characteristics of the filtering process in three or more reference band positions, respectively, and the band position of the attenuation band is specifiable by the parameter within a frequency range from the lowest one out of the three or more reference band positions to the highest one out of the three or more reference band positions.

The arithmetic expression for the filter coefficients is obtained by using not only information about reference amplitude characteristics in opposite ends of a frequency range within which the band position of the attenuation band can be specified by the parameter, but also information about reference amplitude characteristics in a middle portion thereof. This prevents a considerable difference between an appropriate bandwidth and a bandwidth of the attenuation band in the middle portion of the above noted frequency range.

The present invention is also intended for a method of designing a digital filter in which a band position of an attenuation band where attenuation is to be enhanced locally in a stopband of amplitude characteristics is variable. According to the present invention, the method includes the steps (a) through (c). The step (a) is to calculate a plurality of sequences of reference filter coefficients based on reference amplitude characteristics of the digital filter. The step (b) is to approximate filter coefficients of the digital filter using a predetermined arithmetic expression including a parameter specifying the band position of the attenuation band, based on the plurality of sequences of the reference filter coefficients. The step (c) is to calculate the filter coefficients using the predetermined arithmetic expression. The step (c) includes the step of (c-1) substituting a value of the parameter into the predetermined arithmetic expression, to change the filter coefficients. The attenuation band is moved to the band position specified by the parameter by performing the step (c-1).

The filter coefficients are changed by using the parameter specifying the band position of the attenuation band which is physical and thus easy to grasp. As such, even when a frequency which must be attenuated is changed, it is possible to easily move the attenuation band by referring to information about a new frequency which must be attenuated. Accordingly, even if a noise frequency is liable to be changed, it is possible to eliminate a noise easily and appropriately by utilizing the designing method according to the present invention. Further, since the filter coefficients are obtained by the arithmetic expression, there is no need of forming the digital filter with multistage filters. This makes it possible to reduce a scale of the digital filter.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 through 8 are graphs showing amplitude characteristics of an optimum filter.

FIG. 9 shows values of coefficients $g_{i,j}$.

FIG. 14 shows respective maximum errors of the optimum filter and a filter used in the signal processor according to the preferred embodiment of the present invention.

DESCRIPTION OF THE PREFERRED EMBODIMENTS

Figure 1:
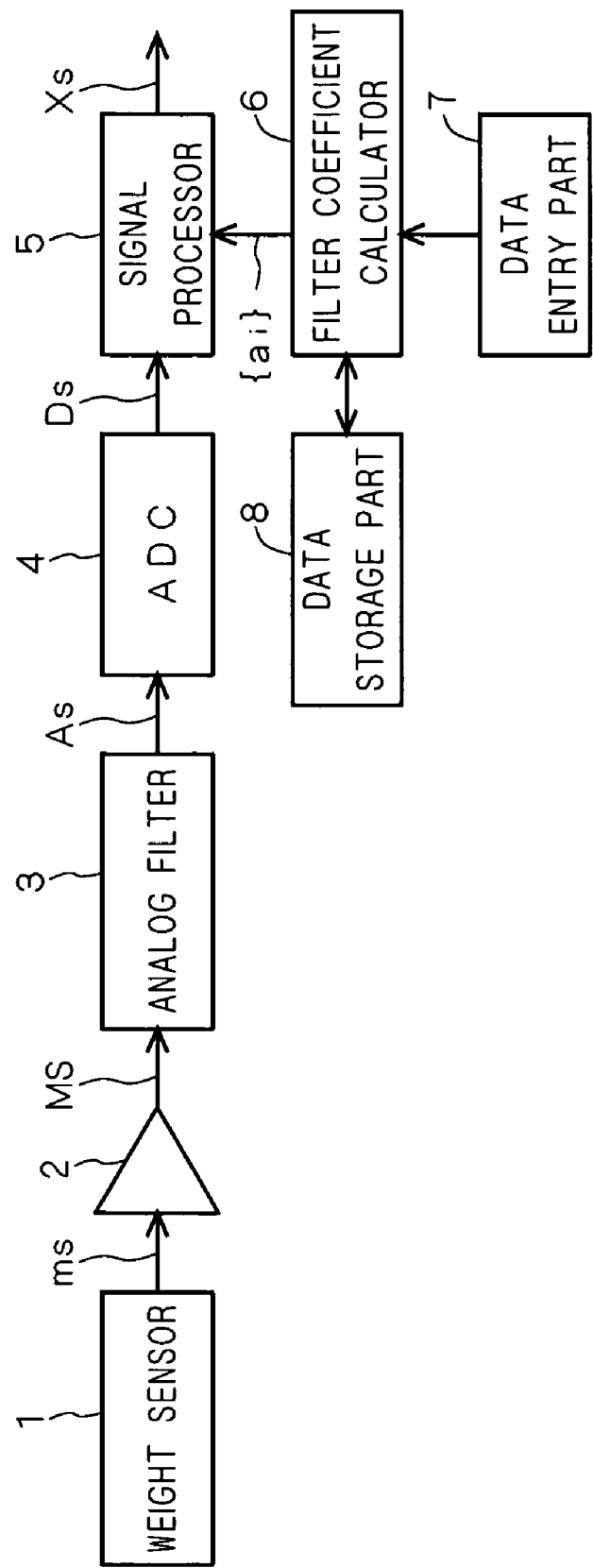
FIG. 1 is a block diagram illustrating a structure of a weight measurement apparatus according to a preferred embodiment of the present invention.

FIG. 1 is a block diagram illustrating a structure of a weight measurement apparatus according to a preferred embodiment of the present invention. As illustrated in FIG. 1, the weight measurement apparatus according to the present embodiment includes a weight sensor 1 such as a strain gauge load cell or a force balance, an amplifier 2, an analog filter 3, an A/D converter (which will be hereinafter referred to as an "ADC") 4, a signal processor 5, a filter coefficient calculator 6, a data entry part 7 and a coefficient storage part 8.

The weight sensor 1 detects a weight of an object under measurement, which is notified by a weight measurement system, and outputs a result of the detection to the amplifier 2, as a measurement signal ms. The amplifier 2 amplifies the measurement signal ms input by the weight sensor 1, and outputs it to the analog filter 3, as an amplified signal MS. The analog filter 3 removes an unnecessary higher frequency component from the amplified signal MS, to output a resultant signal as an analog signal As. The ADC 4 samples the analog signal As output from the analog filter 3 at predetermined sampling intervals, to generate a digital signal which is quantized to be represented by the predetermined number of bits and then output the digital signal to the signal processor 5, as a weighing signal Ds.

The signal processor 5 carries out a filtering process on the weighing signal Ds input by the ADC 4, using a FIR filter, and outputs a result of the filtering process to a microcomputer (not illustrated), as a signal Xs. Then, the microcomputer calculates the weight of the object based on the signal Xs and displays a result of the calculation on a display part (not illustrated). It is noted that generally, a frequency response H ($e^{j\omega}$) of a 2Nth order FIR filter is expressed by the following equation (1):

$$H(e^{j\omega}) = \sum_{i=0}^{N} a_i \cos i\omega. \quad \text{Equation (1)}$$

In the equation (1), "$a_i$" (i=0, 1, 2, ..., N) represents filter coefficients. Also, "ω" represents a normalized angular frequency, that is, an angular frequency normalized by using a sampling frequency used for a filtering process on data. In the present embodiment, an angular frequency which is normalized by using a sampling frequency used for the filtering process on data carried out by the signal processor 5 corresponds to the normalized angular frequency represented by "ω". It is noted that the terms "normalized angular frequency" will hereinafter mean such an angular frequency as defined above, i.e., an angular frequency which is normalized by using a sampling frequency, throughout the present specification.

Figure 2:
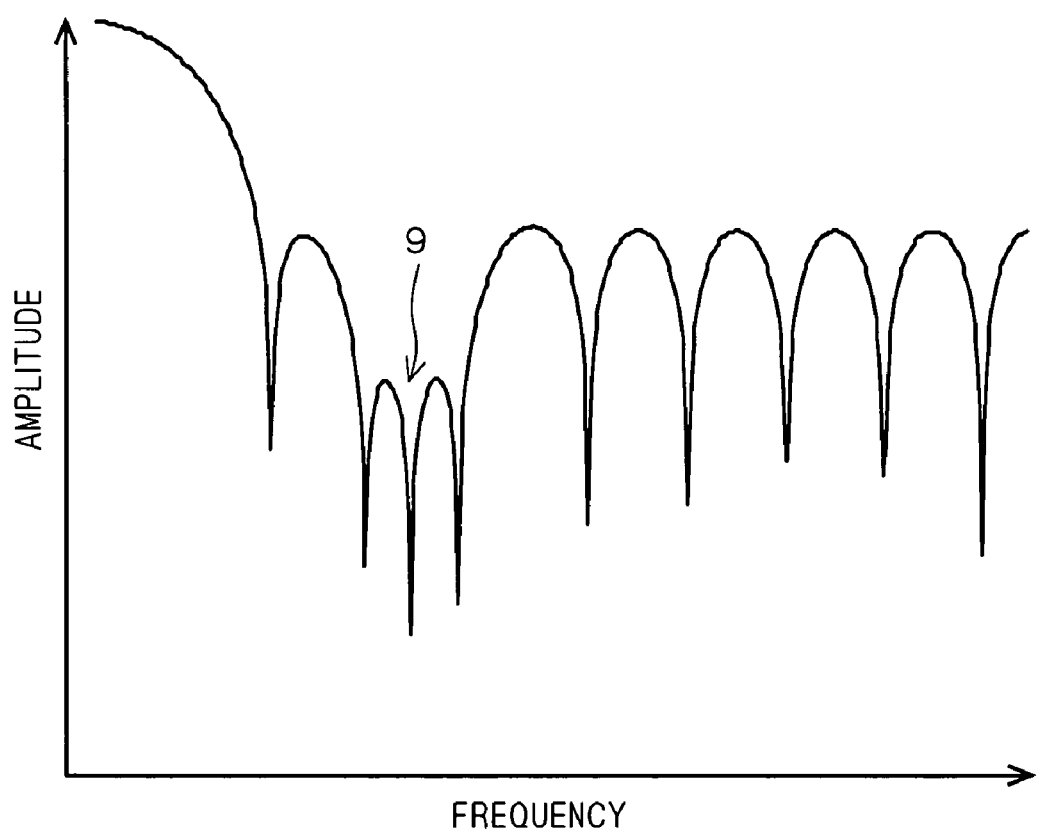
FIG. 2 is a graph showing amplitude characteristics of a filtering process in a signal processor according to the preferred embodiment of the present invention.

FIG. 2 is a graph showing an example of amplitude characteristics of the filtering process carried out by the signal processor 5. As shown in FIG. 2, the FIR filter used in the signal processor 5 is a low pass filter, so that an attenuation band 9 where attenuation is locally great is present in a stopband of the amplitude characteristics. The weight measurement apparatus according to the present embodiment can function to change a band position of the attenuation band 9. More specifically, the weight measurement apparatus can function to move the attenuation band 9 to a higher frequency position or a lower frequency position. It is noted that the terms "attenuation band" will hereinafter mean a band where attenuation must be enhanced locally in a stopband, like the attenuation band 9 shown in FIG. 2, throughout the present specification.

The filter coefficient calculator 6 calculates sequences $\{a_i\}$ of the filter coefficients $a_i$ in the above equation (1) using the following equation (2), and outputs a result of the calculation to the signal processor 5:

$$a_i = b_i(x) = \quad \text{Equation (2)}$$
$$\sum_{j=0}^{M} g_{i,j} x^{M-j} g_{i,0} x^M + g_{i,1} x^{M-1} + \ldots + g_{i,M-1} x + g_{i,M}.$$

In the equation (2), "$g_{i,j}$" (j=0, 1, 2, ... M) represents coefficients. Also, "x" represents a parameter specifying a band position of an attenuation band, and a value substituted for x is varied in accordance with the position of the attenuation band. As shown in the equation (2), the filter coefficients $a_i$ are expressed by a polynomial including a plurality of terms for the parameter x. Then, by substituting the equation (2) into the equation (1), the frequency response H ($e^{j\omega}$) can be expressed by the following equation (3):

$$H(e^{j\omega}) = \sum_{i=0}^{N} \sum_{j=0}^{M} g_{i,j} x^{M-j} \cos i\omega. \quad \text{Equation (3)}$$

The coefficient storage part 8 is a ROM (Read-Only Memory), for example, and previously stores values of the coefficients $g_{i,j}$. The values of the coefficients $g_{i,j}$ are read out from the coefficient storage part 8 by the filter coefficient calculator 6.

The data entry part 7 is a keyboard, for example, and receives a value of the parameter x which is input by a user external to the weight measurement apparatus. The data entry part 7 then outputs the received value of the parameter x to the filter coefficient calculator 6.

Next, operations for measuring a weight of an object in the weight measurement apparatus according to the present embodiment will be described with reference to a flow chart in FIG. 3.

Figure 3:
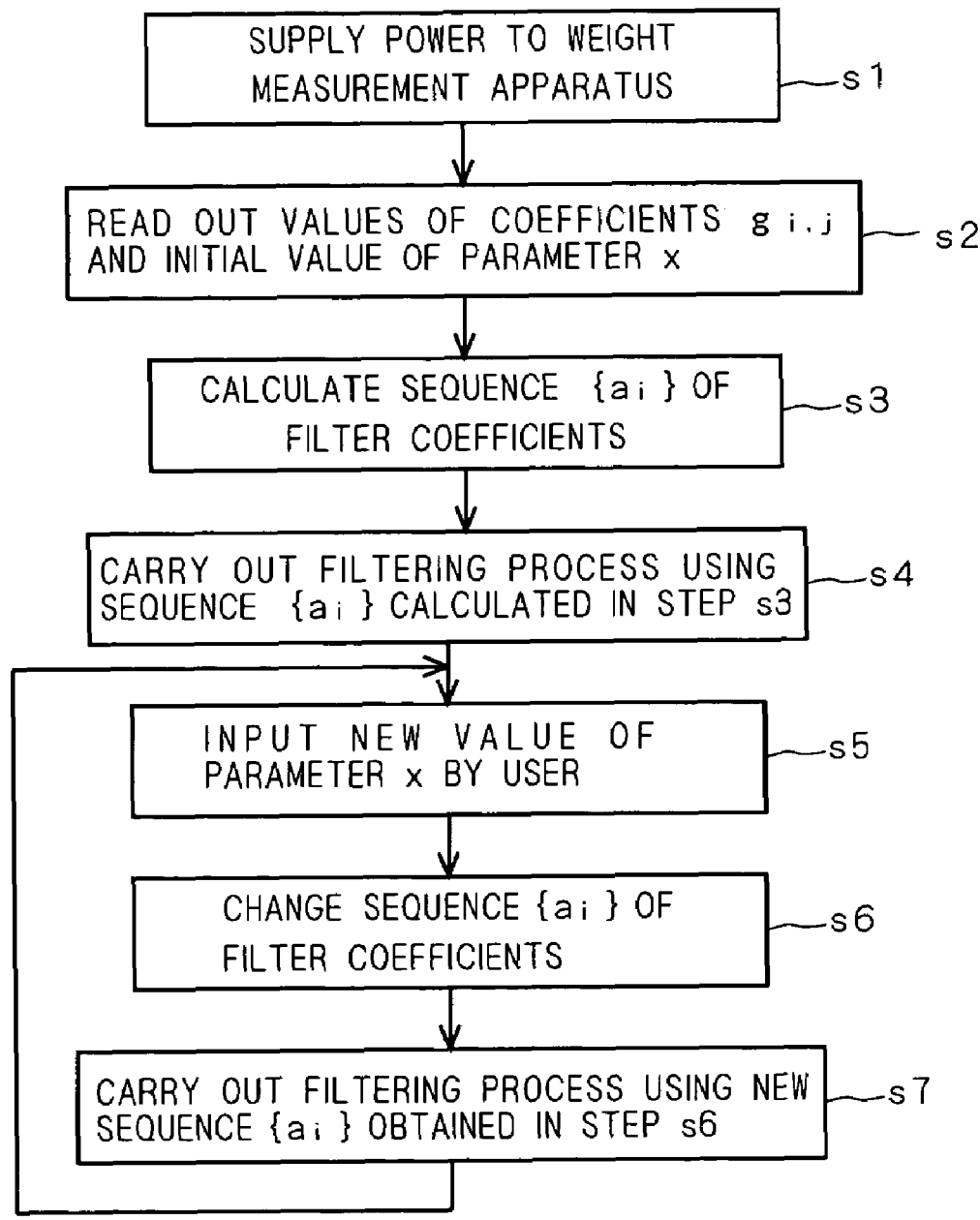
FIG. 3 is a flow chart illustrating operations for measuring a weight in the weight measurement apparatus according to the preferred embodiment of the present invention.
Figure 6:
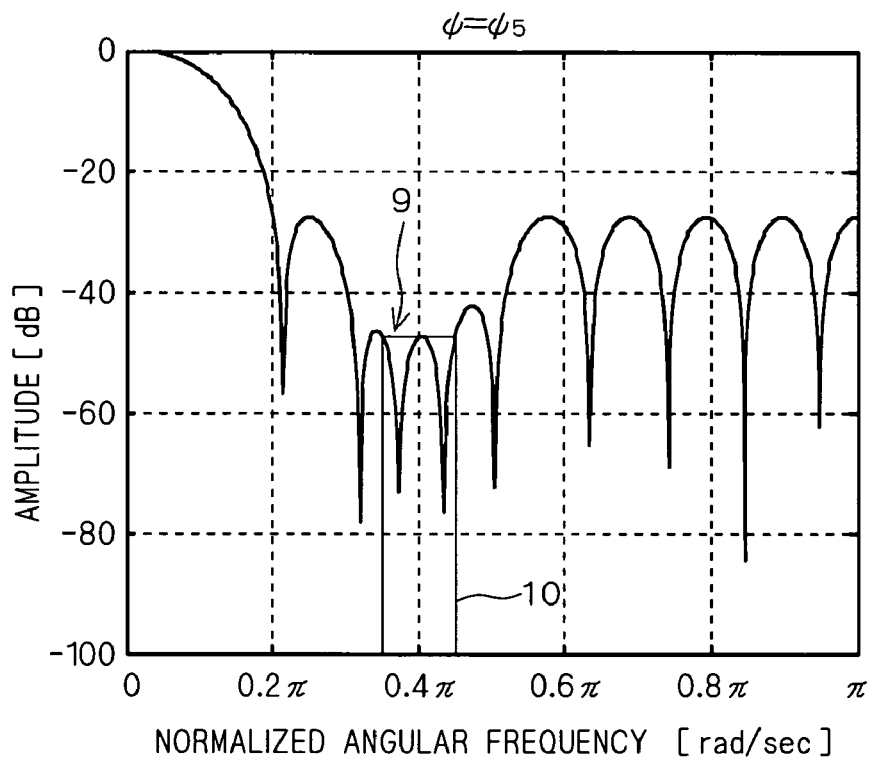
Figure 7:
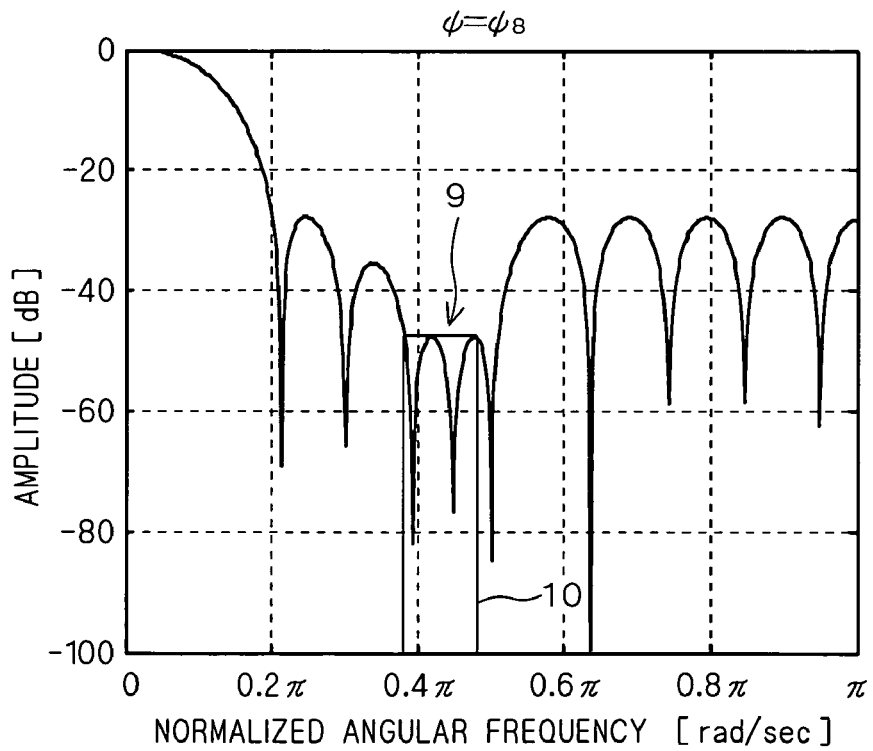

As illustrated in FIG. 3, power is supplied to the weight measurement apparatus in a step s1. In a subsequent step s2, the filter coefficient calculator 6 reads out the values of the coefficients $g_{i,j}$ from the coefficient storage part 8, and further reads out an initial value of the parameter x which is previously stored therewithin.

Then, the filter coefficient calculator 6 substitutes the values of the coefficients $g_{i,j}$ and the initial value of the parameter x into the equation (2), to calculate one sequence $\{a_i\}$ of the filter coefficients and output it to the signal processor 5, in a step s3. As a result, a band position of an attenuation band in filtering characteristics exhibited in the signal processor 5 is set to an initial position specified by the parameter x. It is noted that the filter coefficients $a_i$ can be calculated promptly because the equation (2) for calculating the filter coefficients as are expressed by a polynomial.

Thereafter, in a step s4, the signal processor 5 carries out a filtering process on the weighing signal Ds using the one sequence $\{a_i\}$ of the filter coefficients which has been calculated in the step s3. Further, the signal processor 5 outputs a result of the filtering process to the microcomputer, as the signal Xs, and the microcomputer displays the weight of the object on the display part such as a CRT.

Then, upon receipt of a new value of the parameter x input by a user of the weight measurement apparatus, the data entry part 7 outputs the received new value to the filter coefficient calculator 6 in a step s5.

As described above, change in type of an object or the like results in change in a natural frequency of the weight sensor 1 and thus change in frequency of a natural frequency noise contained in the weighing signal Ds. In this connection, a user of the weight measurement apparatus inputs a value of the parameter x specifying a position of a band including a new natural frequency after the change, in order to surely eliminate the natural frequency noise, in the step s5. For example, information about the natural frequency of the weight sensor 1 for each type of object under measurement is previously prepared, and the user inputs a value of the parameter x to the data entry part 7 while referring to the information, each time the type of the object is changed.

It is noted that though the structure described above is configured so as to require input of a value of the parameter x to the data entry part 7, the structure may alternatively be configured so as to allow a value of the parameter x to be automatically determined. For example, this alternative is possible in a weight measurement apparatus such as a weight checker in which a frequency which must be attenuated can be determined by determining a speed of a conveyor. Further alternatively, automatic determination of a value of the parameter x can be accomplished by carrying out frequency analysis by means of the FFT of a vibration waveform of the measurement signal or the like and then detecting a portion of the waveform which has the greatest amplitude. The structure may be configured so as to implement this procedure.

Turning back to the flow chart, subsequently to the step s5, the filter coefficient calculator 6 substitutes the new value of the parameter x which is received from the data entry part 7 into the equation (2), and changes the one sequence $\{a_i\}$ of the filter coefficients to output a new sequence $\{a_i\}$ to the signal processor 5, in a step s6. As a result, the attenuation band in the filtering characteristics exhibited in the signal processor 5 is moved from the initial band position to a band position specified by the new value of the parameter x. Then, in a step s7, the signal processor 5 carries out a filtering process using the new sequence $\{a_i\}$ of the filter coefficients obtained in the step s6, and outputs a result of the filtering process as the signal Xs.

If there is a need of changing again the position of the attenuation band, the user inputs a further new value of the parameter x to the data entry part 7. Then, the steps s6 and s7 are performed, so that the attenuation band is moved to a band position newly specified by the further new value of the parameter x.

As is made clear from the foregoing description, in the weight measurement apparatus according to the present embodiment, the filter coefficients as can be changed by using the parameter x specifying a band position of an attenuation band which is physical and thus easy to grasp. Accordingly, even when a frequency which must be attenuated in the signal processor 5 is changed due to change in the natural frequency of the weight sensor 1 or the like, it is possible to easily move the attenuation band by referring to information about a new frequency which must be attenuated. Therefore, a frequency of a noise in the weighing signal Ds, which is liable to be changed, can be filtered out easily and appropriately.

Moreover, as shown in the equation (2), the filter coefficients $a_i$ are obtained by a predetermined arithmetic expression. This eliminates a need of preparing multistage filters which are required in the method of JP 6-21814 described in the Background section, and a need of previously storing filter coefficients representing different characteristics. Therefore, a scale of a circuit necessary for a filtering process can be reduced, which makes it possible to provide a low cost weight measurement apparatus to users.

Next, processes for determining values of the coefficients $g_{i,j}$ will be described. First, ideal amplitude characteristics M ($e^{j\omega}$, $\phi$), in other words, reference amplitude characteristics, and a weight function W ($e^{j\omega}$, $\phi$) of a FIR filter in which a band position of an attenuation band is variable are provided by the following equations (4) and (5):

$$M(e^{j\omega},\phi) = \begin{cases} 1 & 0 \le |\omega| \le \omega_p \\ 0 & \omega_s \le |\omega| \le \varphi \\ 0 & \varphi \le |\omega| \le \varphi + w \\ 0 & \varphi + w \le |\omega| \le \pi \end{cases} \quad \text{Equation (4)}$$

$$W(e^{j\omega},\phi) = \begin{cases} 1 & 0 \le |\omega| \le \omega_p \\ 1 & \omega_s \le |\omega| \le \varphi \\ 10 & \varphi \le |\omega| \le \varphi + w \\ 1 & \varphi + w \le |\omega| \le \pi \end{cases} \quad \text{Equation (5)}$$

In the equations (4) and (5), "$\omega_p$" represents a normalized angular frequency of an edge of a passband, "$\omega_s$" represents a normalized angular frequency of an edge of a stopband, "w" represents a width of an attenuation band, and "$\phi$" represents a parameter controlling a band position of an attenuation band. Among those, a relationship $\omega_s < \phi < \pi - w$ is maintained.

According to the present embodiment, an attenuation band in the reference amplitude characteristics extends over an angular frequency range (which will be hereinafter simply referred to as a "frequency range") from $\phi$ to ($\phi+w$), and a band position of the attenuation band is specified depending on a value of the parameter $\phi$, as shown in the above equation (4). The band position of the attenuation band in the reference amplitude characteristics will hereinafter be referred to as a "reference band position" throughout the present specification.

Subsequently, an optimum filter is designed for each of values $\phi_k$ (k=0, 1, 2, ... K) which is to be substituted for the parameter $\phi$. A larger value of "k" indicates a large value $\phi_k$. In the present embodiment, the optimum filter is designed through successive projections method. Detailed description thereof will be made below.

Given that the filter coefficients $a_i$ provided when the values $\phi_k$ are substituted for the parameter $\phi$ are filter coefficients $a_{i,k}$, a frequency response $H(e^{j\omega}, \phi_k)$ of a digital filter provided when each of the values $\phi_k$ is substituted for the parameter $\phi$ is expressed by the following equation (6):

$$H(e^{j\omega},\phi_k) = \sum_{i=0}^{N} a_{i,k} \cos i\omega. \quad \text{Equation (6)}$$

Then, in order to obtain the filter coefficients $a_{i,k}$ through successive projections method, an error $e(\omega)$ found in an n-time calculation of repeated calculations is expressed by the following equation (7):

$$e(\omega) = \left| M(\omega) - \sum_{i=0}^{N} a_{i,k}^n \cos i\omega \right|. \quad \text{Equation (7)}$$

In the equation (7), "$M(\omega)$" represents the reference amplitude characteristics M ($e^{j\omega}$, $\phi$). It is noted that a superscript "n" of the filter coefficients $a_{i,k}$ represents not an exponent, but the number of repetitions.

Now, given that a frequency at which specifications are most slightly met is "$\omega_M$" and a tolerance relative to the reference amplitude characteristics is "$\lambda(\omega)$", the following equation (8) is established:

$$|e(\omega_M) - \lambda(\omega_M)| = \max_{\omega \in all} |e(\omega) - \lambda(\omega)|. \quad \text{Equation (8)}$$

Given that a tolerance obtained when the weight function W($e^{j\omega}$, $\phi$) is equal to 1 is "$\delta$", the tolerance $\lambda(\omega)$ is expressed by the following equation (9):

$$\lambda(\omega) = \delta / W(\omega) \quad \text{Equation (9).}$$

In the equation (9), "$W(\omega)$" represents the weight function "W($e^{j\omega}$, $\phi$)".

As shown in the equations (5) and (9), a tolerance relative to the attenuation band in the reference amplitude characteristics which is employed in designing the optimal filter is set to one-tenth of a tolerance relative to the other bands in the reference amplitude characteristics, depending on the weight function.

The filter coefficients are updated in successive projections method by using the following equation (10):

$$a_{i,k}^{n+1} = \begin{cases} a_{i,k}^n - \dfrac{\{\lambda(\omega_M) - e_M\}\cos(i\omega_M)\mathrm{sign}(e_M)}{\sum_{i=0}^{N}\cos^2(i\omega_M)} & \\ & \text{if } e_M > \lambda(\omega_M) \\ a_{i,k}^n & \text{if } e_M \leq \lambda(\omega_M). \end{cases} \quad \text{Equation (10)}$$

In the equation (10), "$e_M$" is equal to "$e(\omega_M)$".

The filter coefficients are repeatedly updated using the above equation (10) until they converge, in other words, until $e_M \leq \lambda(\omega_M)$, to thereby obtain optimum filter coefficients $a_{i,k}$.

In this manner, K sequences $\{a_{i,0}\}$, $\{a_{i,1}\}$, ..., $\{a_{i,K}\}$ of the filter coefficients $a_{i,k}$ are obtained based on respective reference amplitude characteristics which are obtained when $\phi_0, \phi_1, \ldots \phi_k$ are substituted for the parameter $\phi$, as well as respective values of the weight function which are obtained when $\phi_0, \phi_1, \ldots \phi_k$ are substituted for the parameter $\phi$. The optimum filter coefficients $a_{i,k}$ obtained based on the reference amplitude characteristics and the weight function will serve as reference filter coefficients $a_{i,k}'$ (k=0, 1, 2, ... K).

Next, least square approximation is carried out on the reference filter coefficients $a_{i,k}'$ using an Mth order polynomial $b_i(x)$ in the equation (2), to determine values of the coefficients $g_{i,j}$.

To this end, a value $b_0(\phi_k)$ obtained when any of the values $\phi_k$ is substituted for the parameter x and the filter coefficients $a_{0,k}'$ are dealt with, first. The following equation (11) is provided:

$$S = \sum_{k=0}^{K}(b_0(\phi_k) - a_{0,k}')^2. \quad \text{Equation (11)}$$

In order to carry out least square approximation on the reference filter coefficients $a_{i,k}'$ using a polynomial $b_i(x)$, to calculate a vector $B_0 = [g_{0,0}\ g_{0,1} \cdots g_{0,M}]^T$ which allows "S" in the above equation (11) to be minimized is statistically preferable, as is well known. A specific procedure for the calculation is to solve simultaneous equations given by the following equation (12) which shows conditions for obtaining maximum and minimum values, for "$g_{0,0}, g_{0,1}, \ldots, g_{0,M}$":

$$\frac{\partial S}{\partial g_{0,0}} = 0, \frac{\partial S}{\partial g_{0,1}} = 0, \ldots, \frac{\partial S}{\partial g_{0,M}} = 0. \quad \text{Equation (12)}$$

Then, expression of the equation (12) using normal equations is as follows:

$$(X^T X)B_0 = X^T A_{0,k} \quad \text{Equation (13)}$$

$$X = \begin{bmatrix} \varphi_0^M & \varphi_0^{M-1} & \cdots & \varphi_0 & 1 \\ \varphi_1^M & \varphi_1^{M-1} & \cdots & \varphi_1 & 1 \\ \vdots & \vdots & & \vdots & \vdots \\ \varphi_K^M & \varphi_K^{M-1} & \cdots & \varphi_K & 1 \end{bmatrix} \quad \text{Equation (14)}$$

$$A_{0,k} = [a_{0,0}'\ a_{0,1}' \cdots a_{0,k}']^T \quad \text{Equation (15).}$$

A matrix X for the equation (12) is obtained based on the values $\phi_k$, and a vector $A_{0,k}$ is obtained based on the reference filter coefficients $a_{i,k}'$ which have been previously obtained through successive projections method. Accordingly, both "$(X^T X)$" on the left side and "$(X^T A_{0,k})$" on the right side of the equation (13) can be obtained, so that the vector $B_0$ can be obtained.

A value $b_1(\phi_k)$ and the reference filter coefficients $a_{1,k}'$, a value $b_2(\phi_k)$ and the reference filter coefficients $a_{2,k}'$, ..., and a value $b_N(\phi_k)$ and the reference filter coefficients $a_{N,k}'$ are dealt with by following the same procedures as described above, to obtain a vector $B_i = [g_{i,0}\ g_{i,1} \cdots g_{i,M}]^T$.

According to the present embodiment, values obtained in the foregoing manner are employed as values of the coefficients $g_{i,j}$ in the equation (2), to thereby allow the parameter x to specify a band position of an attenuation band.

Also, in the present embodiment, when the reference amplitude characteristics is defined as expressed by the equation (4), a value of the parameter x that a user can input should be within a range from $\phi_0$ to $\phi_K$, inclusive ($\phi_0 \leq x \leq \phi_K$). For example, if the user inputs the value $\phi_0$ as a value of the parameter x to the data entry part 7, a band position provided by a frequency range from $\phi_0$ to ($\phi_0$+w) is specified as a band position of the attenuation band. If the user inputs the value $\phi_K$ as a value of the parameter x to the data entry part 7, a band position provided by a frequency range from $\phi_K$ to ($\phi_K$+w) is specified as a band position of the attenuation band.

As described above, the user can specify a band position of an attenuation band within a frequency range from a reference band position in the reference amplitude characteristics provided when $\phi=\phi_0$ to another reference band position in the reference amplitude characteristics provided when $\phi=\phi_K$, by means of the parameter x. Also, by previously preparing a table establishing a correspondence between a value of the parameter x and a band position of an attenuation band, the user can easily specify a desired band position.

Additionally, the weight function $W(e^{j\omega}, \phi)$ determines a weight of a tolerance used in designing the optimum filter for each frequency range, as described above. Accordingly, attenuation in the attenuation band in the filtering characteristics exhibited in the signal processor 5 is specified depending on a value of the weight function ($e^{j\omega}$, $\phi$) provided when a relationship) $\phi \leq |\omega| \leq \phi+w$ is maintained. In the present embodiment, attenuation in the attenuation band which is provided by the signal processor 5 is set to ten times of attenuation in the other bands in the stopband, as shown in the equation (5).

Next, specific description will be made about how a band position of an attenuation band is changed on an axis of frequency depending on a value of the parameter x, by substituting specific numerical values for the coefficients $g_{i,j}$.

First, conditions are laid down as follows, for example.

$$\omega_p = 0.05\pi \quad \text{Equation (16)}$$

$$\omega_s = 0.27\pi \quad \text{Equation (17)}$$

$$w = 0.1\pi \quad \text{Equation (18)}$$

$$\delta = 0.042 \quad \text{Equation (19)}$$

$$N = 10 \quad \text{Equation (20)}$$

Also, assume that $\phi$ is in a range from $0.3\pi$ to $0.4\pi$, inclusive ($0.3\pi \leq \phi \leq 0.4\pi$) and that discrete values obtained by dividing the range into 11 equal parts correspond to the values $\phi_k$(k=0, 1, ..., 10). Then, $\phi_0$ is $0.3\pi(\phi_0=0.3\pi)$, $\phi_1$ is $0.31\pi(\phi_1=0.31\pi)$, $\phi_2$ is $0.32\pi(\phi_2=0.32\pi)$, ..., and $\phi_{10}$ is $0.4\pi(\phi_{10}=0.4\pi)$. Accordingly, a range of a value which can be substituted for the parameter x is $0.3\pi \leq x \leq 0.4\pi$.

FIGS. 4 through 8 are graphs showing amplitude characteristics of an optimum filter having the reference filter coefficients $a_{i,k}'$ obtained under the above-noted conditions. FIGS. 4 through 8 show the amplitude characteristics which are observed in situations where $\phi$ is $\phi_0$, $\phi_2$, $\phi_5$, $\phi_8$, and $\phi_{10}$, respectively. The reference amplitude characteristics is assumed with respect to each of the situations shown in FIGS. 4 through 8, respectively, and a solid line 10 in each of the graphs denotes a reference band position (within a frequency range from $\phi$ to $(\phi+w)$) of each reference amplitude characteristics.

Referring to FIGS. 4 through 8, it is appreciated that a band position of the attenuation band 9 in the optimum filter is changed in accordance with a value of the parameter $\phi$, and that an equal ripple property is found in bands other than the attenuation band 9 in the stopband.

Figures 8, 9:
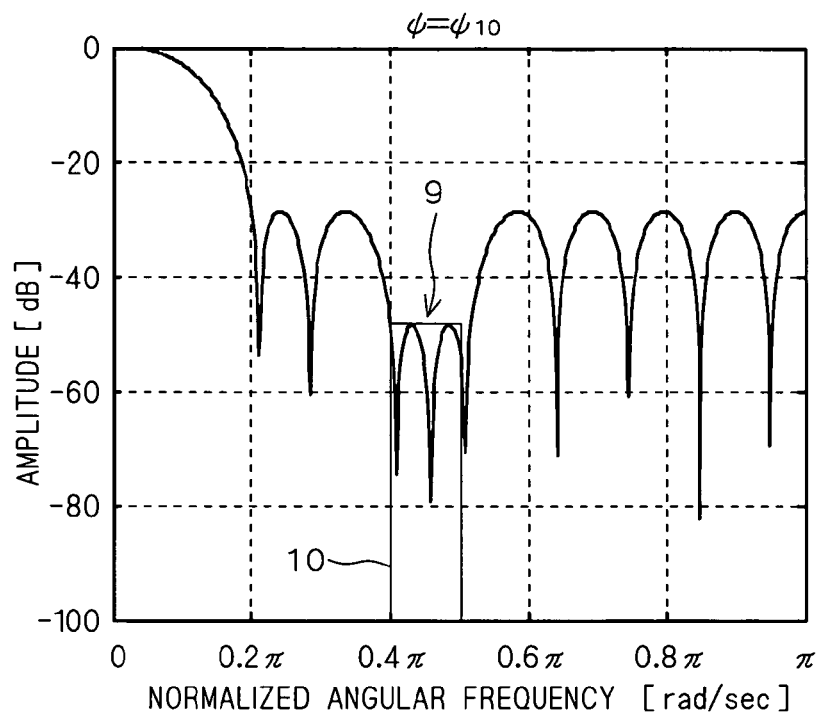

Next, the reference filter coefficients $a_{i,k}'$ obtained under the above-noted conditions are approximated by a fifth order polynomial (M=5), to determine values of the coefficients $g_{i,j}$, which are shown in FIG. 9.

Figure 10:
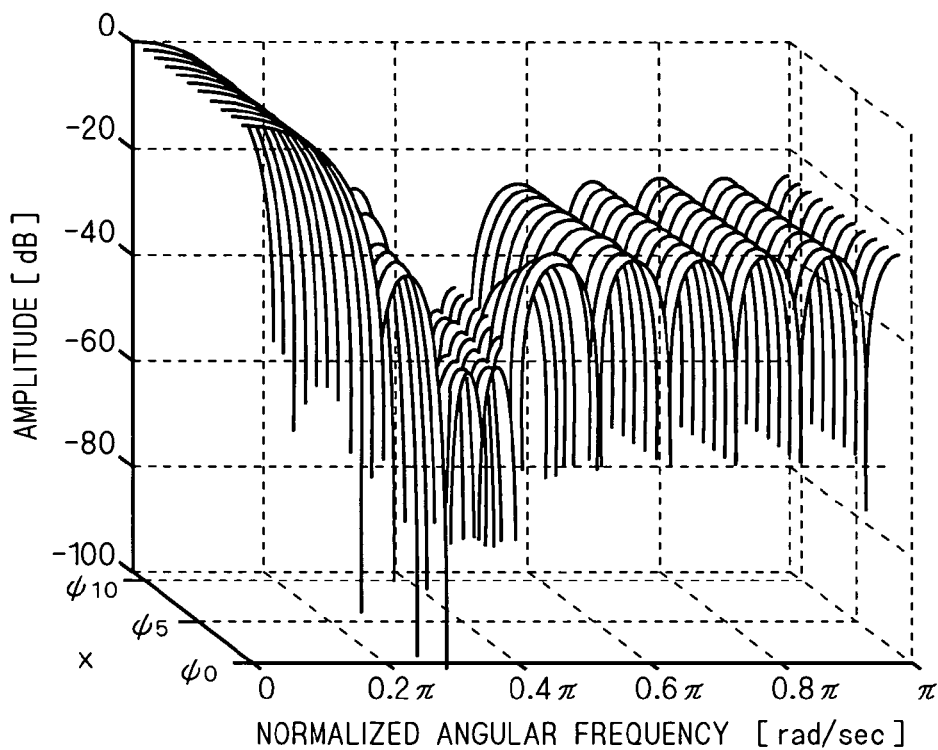
FIGS. 10 through 13 are graphs showing amplitude characteristics of the filtering process in the signal processor according to the preferred embodiment of the present invention.
Figure 11:
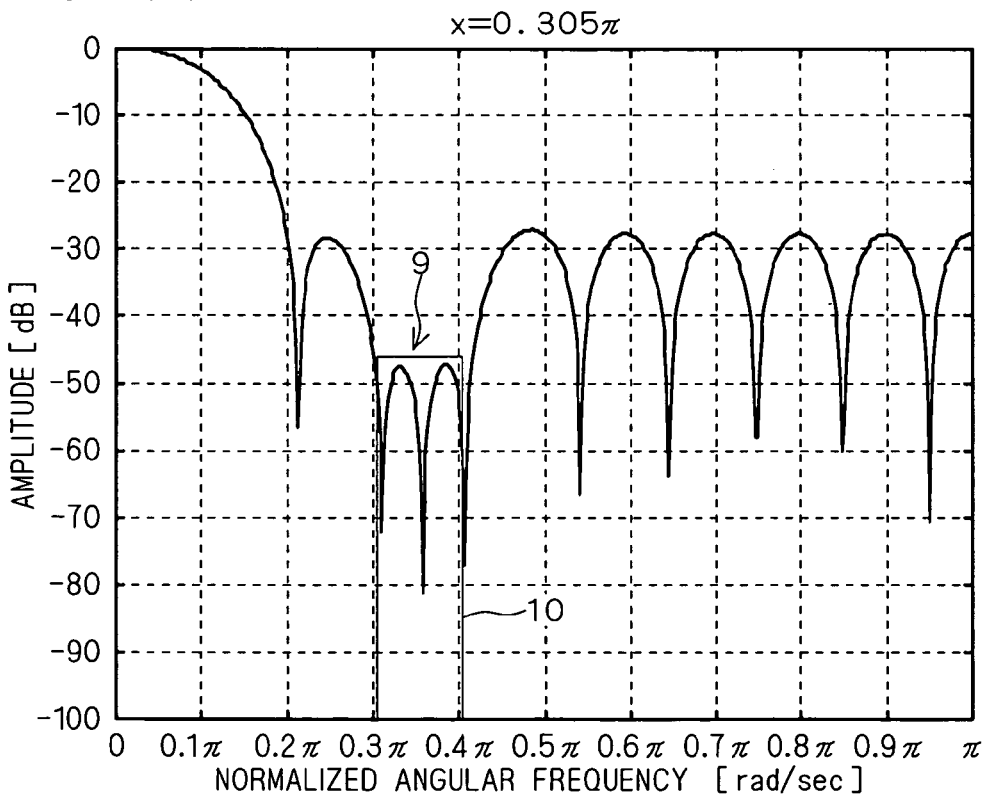
Figure 12:
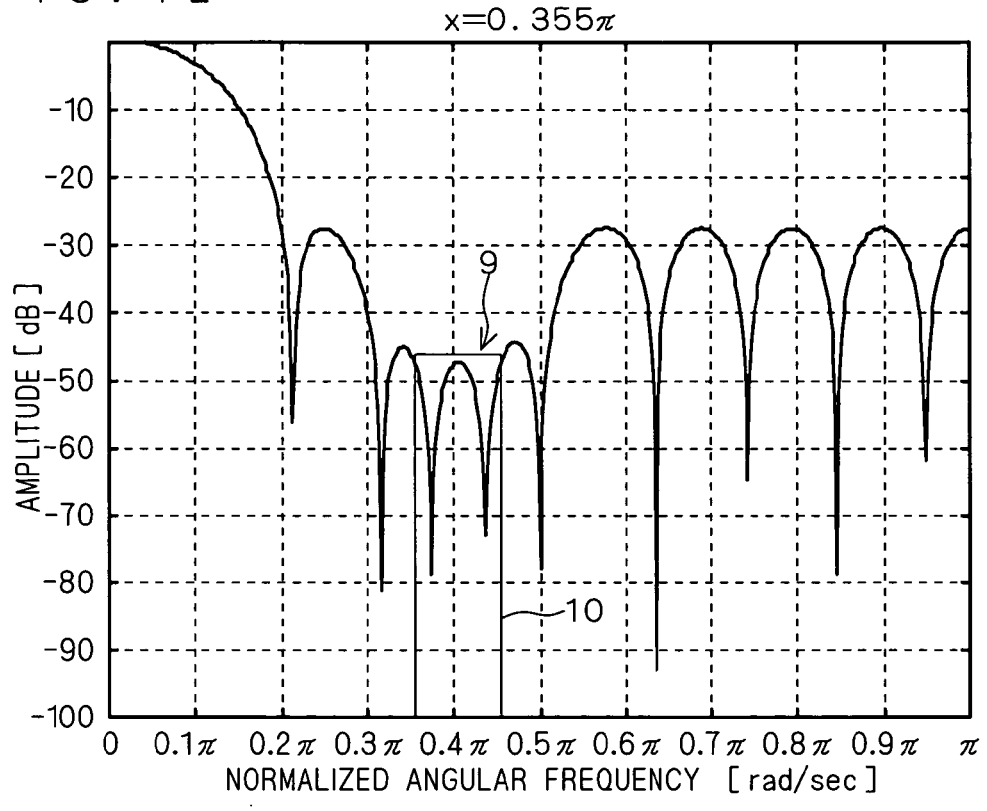
Figure 13:
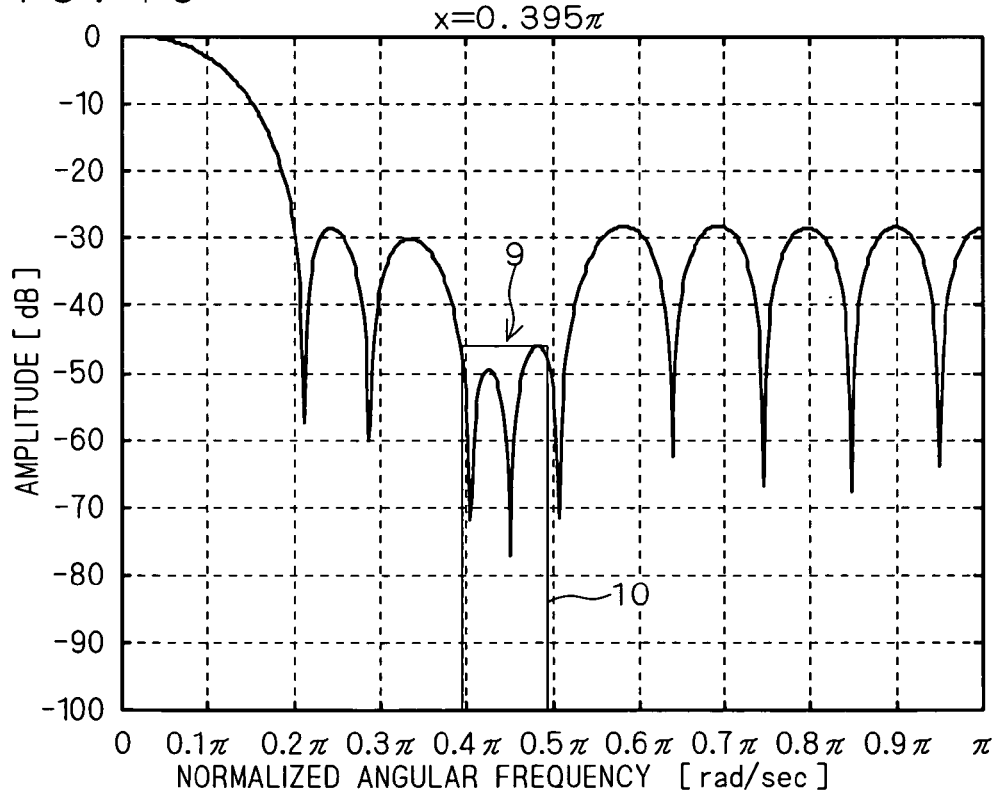

FIGS. 10 through 13 are graphs showing amplitude characteristics of a filtering process which is carried out by the signal processor 5 while the values shown in FIG. 9 are employed as values of the coefficients $g_{i,j}$ in the equation (2). Specifically, FIG. 10 shows characteristics exhibited when the values $\phi_0$, $\phi_1$, ... and $\phi_{10}$ are substituted for the parameter x. FIGS. 11, 12 and 13 show characteristics exhibited when $0.305\pi$, $0.355\pi$ and $0.395\pi$ are substituted for the parameter x, respectively. The reference amplitude characteristics is assumed with respect to each of situations shown in FIGS. 11, 12 and 13, respectively, and the solid line 10 in each of FIGS. 11, 12 and 13 denotes a reference band position (within a frequency range from $\phi$ to $(\phi+w)$) of each reference amplitude characteristics in the same manner as in FIGS. 4 through 8.

Referring to FIG. 11, when $0.305\pi$ is substituted for the parameter x, attenuation becomes great in a frequency range from about $0.305\pi$ to $0.405\pi$ (a range denoted by the solid line 10). Also, referring to FIG. 12, when $0.355\pi$ is substituted for the parameter x, attenuation becomes great in a frequency range from about $0.355\pi$ to $0.455\pi$. Then, turning to FIG. 13, when $0.395\pi$ is substituted for the parameter x, attenuation becomes great in a frequency range from about $0.395\pi$ to $0.495\pi$.

It is appreciated from FIGS. 11, 12 and 13 that attenuation becomes great locally in a band position specified by the parameter x. Further, it is appreciated from FIGS. 10 through 13 that attenuation in the attenuation band 9 is about ten times (20 dB) greater than that in bands other than the attenuation band in the stopband.

FIG. 14 shows a maximum error in the amplitude characteristics of the optimum filter having the reference filter coefficients $a_{i,k}'$ obtained under the above-noted conditions and a maximum error in the amplitude characteristics of the filter used in the signal processor 5. The filter used in the signal processor 5 corresponds to a filter having the filter coefficients $a_i$ which are approximated by an Mth order polynomial $b_i(x)$ including the coefficients $g_{i,j}$ having the values shown in FIG. 9. It is noted that frequency ranges ①, ②, ③ and ④ in FIG. 14 are a frequency range of $0 \leq |\omega| \leq \omega_p$, a frequency range of $\omega_s \leq |\omega| \leq \phi_k$, a frequency range of $\phi_k \leq |\omega| \leq \phi_k+W$, and a frequency range of $\phi_k+w \leq |\omega| \leq \pi$, respectively.

As shown in FIG. 14, the respective maximum errors of the optimum filter and the filter used in the signal processor 5 have the substantially same value as a result of approximating the filter coefficients by a fifth order polynomial based on one sequence $\{a_{i,k}'\}$ of the reference filter coefficients.

As is made clear from the foregoing description, in the weight measurement apparatus according to the present embodiment, the filter coefficients $a_i$ can be changed by using the parameter x specifying a band position of an attenuation band which is physical and thus easy to grasp. Accordingly, it is possible to easily change a band position of the attenuation band. Therefore, a frequency of a noise in the weighing signal Ds, which is liable to be changed, can be filtered out easily and appropriately.

Additionally, the number of the values $\phi_k$(k=0, 1, ..., K) to be substituted for the parameter $\phi$ used in obtaining the coefficients $g_{i,j}$ is preferably three or more (K≧3) for the following reasons.

According to the present invention, an attenuation band with a width extending along an axis of frequency is moved by using the parameter x. As such, it is desired to bring a width of the attenuation band close to an appropriate band width (the band width w in the equation (4)) not only in opposite ends of a frequency range within which the band position of the attenuation band can be specified by the parameter x (which will hereinafter be referred to as a "specified frequency range"), but also in a middle portion of the specified frequency range.

To this end, the number of the values $\phi_k$ is set to three or more. This results in the sequences $\{a_{i,k}'\}$ of the reference filter coefficients being calculated based on not only reference amplitude characteristics in the opposite ends of the specified frequency range, i.e., reference amplitude characteristics exhibited when $\phi=\phi_0$ and $\phi=\phi_k$, but also reference characteristics in the middle portion thereof. The sequences $\{a_{i,k}'\}$ of the reference filter coefficients which have been calculated in that way is used in determining values of the coefficients $g_{i,j}$ in the equation (2). In other words, to set the number of the values $\phi_k$ to three or more would allow the equation (2) for the filter coefficients to be derived from not only the reference amplitude characteristics in the opposite ends of the specified frequency range, but also the reference amplitude characteristics in the middle portion thereof. This prevents a considerable difference between the appropriate band width w and the band width of the attenuation band in the middle portion of the specified frequency range, as well as between the appropriate band width w and the band width of the attenuation band in the opposite ends of the specified frequency range.

Moreover, though the above description in the present embodiment has been made with respect to a weight measurement apparatus, the present invention can also be applied to a general method of designing a digital filter. Below, a brief description about a method of designing a digital filter in which a position of an attenuation band is variable will be made.

First, a plurality of sequences $\{a_{i,k}'\}$ of reference filter coefficients are calculated from reference amplitude characteristics in the same manner as described above. Subsequently, values of the coefficients $g_{i,j}$ are determined using the calculated sequences $\{a_{i,k}'\}$, and the filter coefficients $a_{i,k}$ of the digital filter are approximated by the equation (2). Then, a value is substituted for the parameter x in the equation (2), to obtain one sequence $\{a_i\}$ of the filter coefficients of the digital filter.

In order to change the band position of the attenuation band in filtering characteristics, the value of the parameter x is changed to thereby change the filter coefficients. As a result, the attenuation band is moved to a new band position newly specified by the parameter x.

By employing the foregoing method of designing a digital filter, it is possible to easily move an attenuation band. Accordingly, even if a noise frequency is liable to be changed, it is possible to eliminate a noise easily and appropriately. Further, as the filter coefficients are obtained by an arithmetic expression, there is no need for forming the digital filter with multistage filters which are required in JP 6-21814. Therefore, a scale of a circuit of the digital filter can be reduced.

While the invention has been shown and described in detail, the foregoing description is in all aspects illustrative and not restrictive. It is therefore understood that numerous modifications and variations can be devised without departing from the scope of the invention.

What is claimed is:

1. A weight measurement apparatus comprising:
   a signal processor for carrying out a filtering process on a weighing signal which is obtained by digitizing a signal resulted from detection of a weight of an object, by using variable filter coefficients; and
   a filter coefficient calculator for calculating said filter coefficients using a predetermined arithmetic expression and outputting said filter coefficients to said signal processor, wherein
   said arithmetic expression includes a parameter specifying a band position of an attenuation band where attenuation is to be enhanced locally in a stopband of amplitude characteristics of said filtering process, and
   said filter coefficient calculator substitutes an input value of said parameter into said arithmetic expression, to change said filter coefficients so that said attenuation band is movable to said band position specified by said parameter.

2. The weight measurement apparatus according to claim 1, wherein
   said arithmetic expression is an approximate expression based on at least three sequences of reference filter coefficients,
   said at least three sequences of said reference filter coefficients correspond to reference amplitude characteristics of said filtering process in three or more reference band positions, respectively, and
   said band position of said attenuation band is specifiable by said parameter within a frequency range from the lowest one out of said three or more reference band positions to the highest one out of said three or more reference band positions.

3. The weight measurement apparatus according to claim 1, further comprising
   a data entry part for receiving said value of said parameter which is input externally to said weight measurement apparatus and outputting said value of said parameter to said filter coefficient calculator.

4. The weight measurement apparatus according to claim 1, wherein
   said arithmetic expression is expressed by a polynomial with a plurality of terms for said parameter.

5. The weight measurement apparatus according to claim 1, wherein
   said signal processor carries out said filtering process by using a finite impulse response (FIR) digital filter.

6. A method of eliminating a noise employed in a weight measurement apparatus, comprising the steps of:
   (a) calculating filter coefficients using a predetermined arithmetic expression: and
   (b) carrying out a filtering process on a weighing signal which is obtained by digitizing a signal resulted from detection of a weight of an object, using said filter coefficients calculated in said step (a), wherein
   said arithmetic expression includes a parameter specifying a band position of an attenuation band where attenuation is to be enhanced locally in a stopband of amplitude characteristics of said filtering process,
   said step (a) includes the step of (a-1) substituting a value of said parameter into said arithmetic expression, to change said filter coefficients, and
   said attenuation band is moved to said band position specified by said parameter by performing said step (a-1).

7. The method of eliminating a noise according to claim 6, wherein
   said arithmetic expression is an approximate expression based on at least three sequences of reference filter coefficients,
   said at least three sequences of said reference filter coefficients correspond to reference amplitude characteristics of said filtering process in three or more reference band positions, respectively, and
   said band position of said attenuation band is specifiable by said parameter within a frequency range from the lowest one out of said at least thee reference band positions to the highest one out of said at least three reference band positions.

8. The method of eliminating a noise according to claim 6, further comprising the step of
   (c) receiving said value of said parameter which is input externally to said weight measurement apparatus, wherein
   said value of said parameter received in said step (c) is substituted into said arithmetic expression in said step (a-1).

9. A method of designing a digital filter in which a band position of an attenuation band where attenuation is to be enhanced locally in a stopband of amplitude characteristics is variable, said method comprising the steps of:
   (a) calculating a plurality of sequences of reference filter coefficients based on reference amplitude characteristics of said digital filter;
   (b) approximating filter coefficients of said digital filter using a predetermined arithmetic expression including a parameter specifying said band position of said attenuation band, based on said plurality of sequences of said reference filter coefficients; and
   (c) calculating said filter coefficients using said predetermined arithmetic expression, wherein
   said step (c) includes the step of (c-1) substituting a value of said parameter into said predetermined arithmetic expression, to change said filter coefficients, and
   said attenuation band is moved to said band position specified by said parameter by performing said step (c-1).

* * * * *

UNITED STATES PATENT AND TRADEMARK OFFICE
CERTIFICATE OF CORRECTION

PATENT NO. : 7,222,144 B2
APPLICATION NO. : 10/693973
DATED : May 22, 2007
INVENTOR(S) : Naoyuki Aikawa et al.

It is certified that error appears in the above-identified patent and that said Letters Patent is hereby corrected as shown below:

Col. 6, line 28, delete "as" and insert -- $a_i$ --, therefor.

Col. 7, line 22, delete "as" and insert -- $a_i$ --, therefor.

Col. 9, line 38 (approximate), delete "$a'_{0,k}$" and insert -- $a_{0,k}'$ --

Col. 10, line 46 (approximate), after "relationship" delete ")".

Col. 10, line 61 (approximate), delete "$\omega_s = 0.27\pi$" and insert -- $\omega_s = 0.2\pi$ --, therefor.

Col. 12, line 61, delete "$\{_{a,k}'\}$" and insert -- $\{a_{i,k}'\}$ --, therefore.

Signed and Sealed this

Twenty-first Day of August, 2007

JON W. DUDAS
*Director of the United States Patent and Trademark Office*